(12) United States Patent
Huang et al.

(10) Patent No.: US 10,388,689 B2
(45) Date of Patent: Aug. 20, 2019

(54) FINGERPRINT IDENTIFICATION SYSTEM, SENSING METHOD AND MANUFACTURING METHOD

(71) Applicant: Egis Technology Inc., Taipei (TW)

(72) Inventors: Yu-Hsiang Huang, Taipei (TW);
Chen-Chih Fan, Taipei (TW);
Tong-Long Fu, Taipei (TW)

(73) Assignee: Egis Technology Inc., Taipei (TW)

( * ) Notice: Subject to any disclaimer, the term of this patent is extended or adjusted under 35 U.S.C. 154(b) by 101 days.

(21) Appl. No.: 15/871,935

(22) Filed: Jan. 15, 2018

(65) Prior Publication Data
US 2018/0233531 A1  Aug. 16, 2018

Related U.S. Application Data

(60) Provisional application No. 62/458,228, filed on Feb. 13, 2017.

(30) Foreign Application Priority Data

Dec. 25, 2017 (CN) .......................... 2017 1 1422172

(51) Int. Cl.
*H01L 27/146* (2006.01)
*G06K 9/00* (2006.01)
(Continued)

(52) U.S. Cl.
CPC ...... *H01L 27/14678* (2013.01); *G06K 9/0004* (2013.01); *G06K 9/00013* (2013.01);
(Continued)

(58) Field of Classification Search
CPC .............. G06K 9/0004; G06K 9/00013; H01L 27/14678; H01L 27/14623;
(Continued)

(56) References Cited

U.S. PATENT DOCUMENTS

| 5,726,443 A | 3/1998 | Immega |
|---|---|---|
| 2016/0224816 A1 | 8/2016 | Smith |

(Continued)

*Primary Examiner* — Brenda C Bernardi
(74) *Attorney, Agent, or Firm* — Winston Hsu

(57) ABSTRACT

A fingerprint identification system, comprising panel, for placing finger; light source, disposed under panel, for generating incident light, wherein incident light is emitted to and reflected by finger to generate reflected light; processor, for performing fingerprint identification on finger according to plurality of sensing signals; and optical sensing array, disposed under panel and coupled to processor, comprising plurality of sensing units for generating plurality of sensing signals, each of sensing units comprising optical sensor, for receiving reflected light reflected by finger to generate sensing signal; focusing layer, disposed under panel, for focusing reflected light reflected by finger; blocking layer, disposed under focusing layer, for blocking part of reflected light to reduce diffraction phenomenon of reflected light; shading layer, disposed under blocking layer, for blocking part of reflected light to limit incident angle of reflected light; and aperture layer, disposed under shading layer and on optical sensor, for blocking stray light.

18 Claims, 6 Drawing Sheets

(51) Int. Cl.
*H01L 27/32* (2006.01)
*H01L 25/18* (2006.01)

(52) U.S. Cl.
CPC .. *H01L 27/14623* (2013.01); *H01L 27/14625* (2013.01); *H01L 27/14685* (2013.01); *H01L 25/18* (2013.01); *H01L 27/3234* (2013.01)

(58) Field of Classification Search
CPC ......... H01L 27/14685; H01L 27/14625; H01L 27/3234; H01L 25/18
See application file for complete search history.

(56) References Cited

U.S. PATENT DOCUMENTS

| | | | |
|---|---|---|---|
| 2016/0254312 A1 | 9/2016 | Lee | |
| 2017/0161543 A1* | 6/2017 | Smith | G06K 9/0008 |
| 2017/0161544 A1* | 6/2017 | Fomani | G01J 1/0214 |
| 2017/0220840 A1* | 8/2017 | Wickboldt | G06K 9/0053 |
| 2017/0220844 A1* | 8/2017 | Jones | G06K 9/0053 |
| 2017/0262686 A1* | 9/2017 | Gao | G06K 9/0004 |
| 2018/0081098 A1* | 3/2018 | Smith | G02B 27/58 |
| 2018/0293452 A1* | 10/2018 | Chung | G06K 9/3216 |
| 2019/0065809 A1* | 2/2019 | Li | G06F 3/0421 |

\* cited by examiner

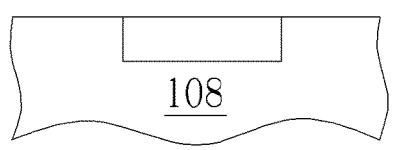
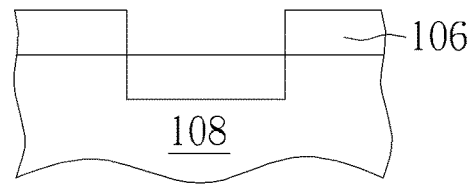
FIG. 3A                FIG. 3B
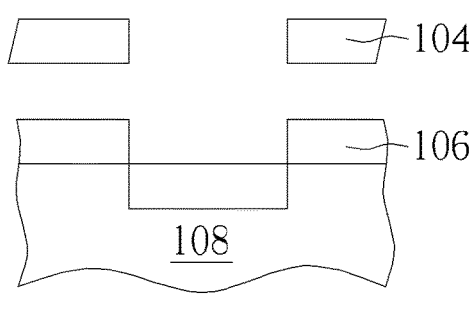
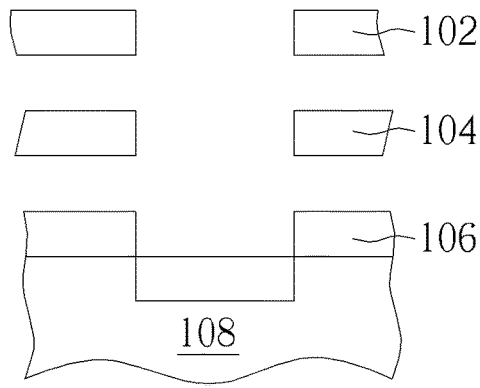
FIG. 3C                FIG. 3D
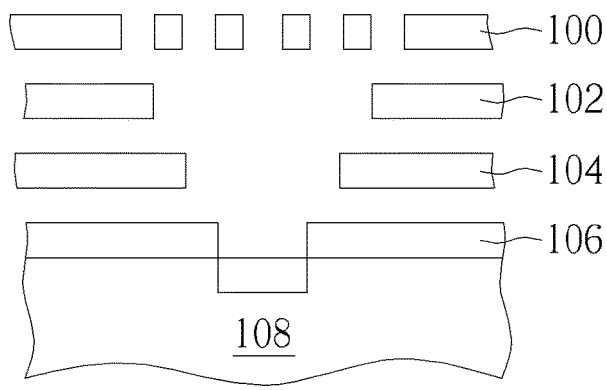
FIG. 3E

FINGERPRINT IDENTIFICATION SYSTEM, SENSING METHOD AND MANUFACTURING METHOD

CROSS REFERENCE TO RELATED APPLICATIONS

This application claims the benefit of U.S. Provisional Application No. 62/458228, filed on Feb. 13, 2017 and entitled "Multi-zone Plate's Focusing system", the contents of which are incorporated herein in their entirety.

BACKGROUND OF THE INVENTION

1. Field of the Invention

The present invention relates to a fingerprint identification system, sensing method and manufacturing method, and more particularly, to a fingerprint identification system, sensing method and manufacturing method capable of focusing reflected light reflected by a finger to increase recognition rate of fingerprint identification.

2. Description of the Prior Art

The optical fingerprint identification system focuses light to perform fingerprint identification, which can be categorized into imaging and non-imaging optical systems. The imaging optical fingerprint identification system obtains images with larger incident angles and better image quality. However, the components in the imaging system are also larger in size and thickness to better focus the light. The non-imaging optical fingerprint identification system, e.g. a collimator system, is more compact and requires smaller range of incident angles. However, with smaller range of incident angles, the fingerprint image received by the non-imaging optical sensor becomes darker, which further raises the signal-to-noise ratio (SNR) of the fingerprint signal and deteriorates the signal quality of the sensed fingerprint signal.

Therefore, the imaging optical fingerprint identification system requires larger area because the components in the imaging system are larger. The non-imaging optical fingerprint identification system has worse quality of the sensed fingerprint signal due to the narrower range of incident angles of the non-imaging system. Under such circumstances, there is necessity to improve the optical fingerprint identification system in the prior art.

SUMMARY OF THE INVENTION

It is therefore a primary objective of the present invention to provide a non-imaging fingerprint identification system, sensing method and manufacturing method for sensing the reflected lights with a larger range of incident angles with low area cost to improve signal quality of the sensed fingerprint signals.

The present invention provides a fingerprint identification system, comprising a panel, for placing a finger; a light source, disposed under the panel, for generating an incident light, wherein the incident light is emitted to and reflected by the finger to generate a reflected light; a processor, for performing fingerprint identification on the finger according to a plurality of sensing signals; and an optical sensing array, disposed under the panel and coupled to the processor, comprising a plurality of sensing units for generating the plurality of sensing signals, each of the sensing units comprising an optical sensor, for receiving the reflected light reflected by the finger to generate the sensing signal; a focusing layer, disposed under the panel, for focusing the reflected light reflected by the finger; a blocking layer, disposed under the focusing layer, for blocking a part of the reflected light to reduce a diffraction phenomenon of the reflected light; a shading layer, disposed under the blocking layer, for blocking apart of the reflected light to limit an incident angle of the reflected light; and an aperture layer, disposed under the shading layer and on the optical sensor, for blocking a stray light.

The present invention further provides a sensing method for a fingerprint identification system comprising a panel, a light source and an optical sensing array for performing fingerprint identification, the sensing method comprising generating an incident light by the light source of the fingerprint identification system when a user placing a finger on the panel of the fingerprint identification system, wherein the incident light is emitted to and reflected by the finger to generate a reflected light; focusing the reflected light reflected by the finger by light paths of concentric circles of a focusing layer of the fingerprint identification system to; blocking a part of the reflected light after the reflected light passing through the focusing layer by a blocking layer of the fingerprint identification system to reduce a diffraction phenomenon of the reflected light; blocking a part of the reflected light after the reflected light passing through the focusing layer and the blocking layer by a shading layer of the fingerprint identification system to limit an incident angle of the reflected light; blocking a stray light of the reflected light after the reflected light passing through the focusing layer, the blocking layer and the shading layer by an aperture layer of the fingerprint identification system ; and sensing the reflected light after the reflected light passing through the focusing layer, the blocking layer, the shading layer and the aperture layer by an optical sensor of the fingerprint identification system so as to generate a sensing signal.

The present invention also provides a manufacturing method for manufacturing an optical sensing array, comprising forming an optical sensor on a silicon substrate, wherein the optical sensor is utilized for receiving a reflected light from a finger to generate a sensing signal; forming an aperture layer above the optical sensor, wherein the aperture layer is utilized for blocking a stray light of the reflected light; forming a shading layer on the aperture layer, wherein the shading layer is utilized for blocking a part of the reflected light to limit an incident angle of the reflected light; forming a blocking layer on the shading layer, wherein the blocking layer is utilized for blocking a part of the reflected light to reduce a diffraction phenomenon of the reflected light; and forming a focusing layer on the shading layer, wherein the focusing layer is utilized for focusing the reflected light reflected by the finger.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 3A to FIG. 3E illustrate a manufacturing process of the optical sensing array according to an embodiment of the present invention.

DETAILED DESCRIPTION

Figure 1A:
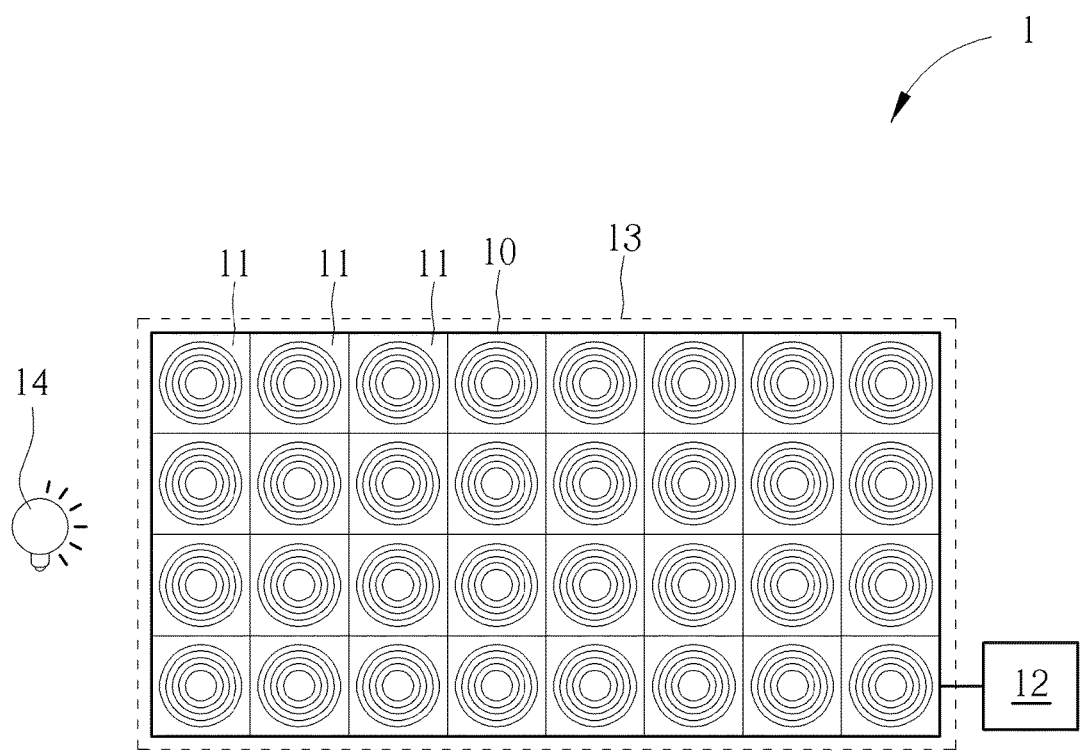
FIG. 1A is a schematic diagram of a fingerprint identification system according to an embodiment of the present invention.
Figure 1B:
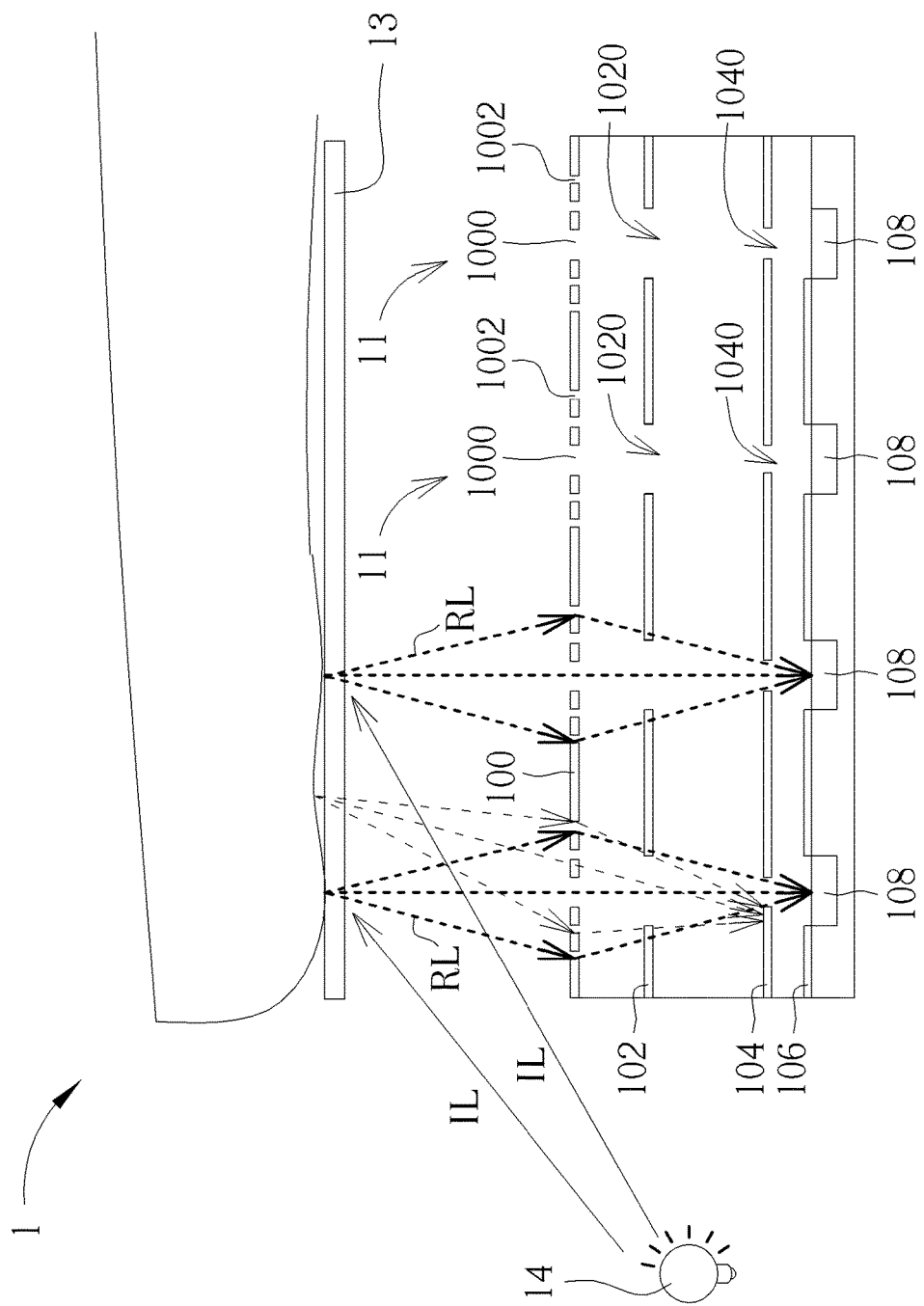
FIG. 1B is a schematic diagram of performing the fingerprint identification by the fingerprint identification system according to an embodiment of the present invention.

Please refer to FIG. 1A and FIG. 1B. FIG. 1A is a schematic diagram of a fingerprint identification system 1 according to an embodiment of the present invention and FIG. 1B is a schematic diagram of the fingerprint identification system 1 performing fingerprint identification according to an embodiment of the present invention. The fingerprint identification system 1 comprises a glass panel 13, a processor 12, an optical sensing array 10 and a light source 14. When a finger of a user is placed on the glass panel 13 of the fingerprint identification system 1, the light source 14 generates an incident light IL, wherein the incident light IL is emitted to and reflected by the finger of the user to generate a reflected light RL. The optical sensing array 10 of the fingerprint identification system 1 senses the reflected light RL reflected by the finger of the user to generate sensing signals. The optical sensing array 10 delivers the sensing signals to the processor 12 to generate fingerprint information and perform fingerprint identification.

In detail, as shown in FIG. 1A, the optical sensing array 10 of the fingerprint identification system 1 comprises a plurality of sensing units 11 arranged in a form of matrix. The spacing or gap between adjacent sensing units 11 may be adjusted according to the width and/or density of the ridges and valleys of the fingerprint and is not limited herein. People skilled in the art may determine the spacing between adjacent sensing units 11 of the optical sensing array 10 according to the width and/or density of the ridges and valleys of the fingerprint, so as to preferably balance the fingerprint image quality and sensor density of the optical sensing array 10. In addition, the arrangement of the optical sensing array 10 is not limited to the checkerboard arrangement as shown in FIG. 1 and may be arranged in a circular form, a cellular form or a honeycomb form, which is also within the scope of the present invention.

In addition, as shown in FIG. 1B, when the user utilizes the fingerprint identification system 1 to perform fingerprint identification, the incident light IL generated by the light source 14 of the fingerprint identification system 1 is emitted to and reflected by the finger of the user, such that the reflected light RL is generated and emitted to the optical sensing array 10. The sensing units 11 of the optical sensing array 10 focus the reflected light RL reflected from the finger, filter out the noise and sense the reflected light RL with incident angles within a specific range so as to perform fingerprint identification and generate sensing signals.

Figure 2:
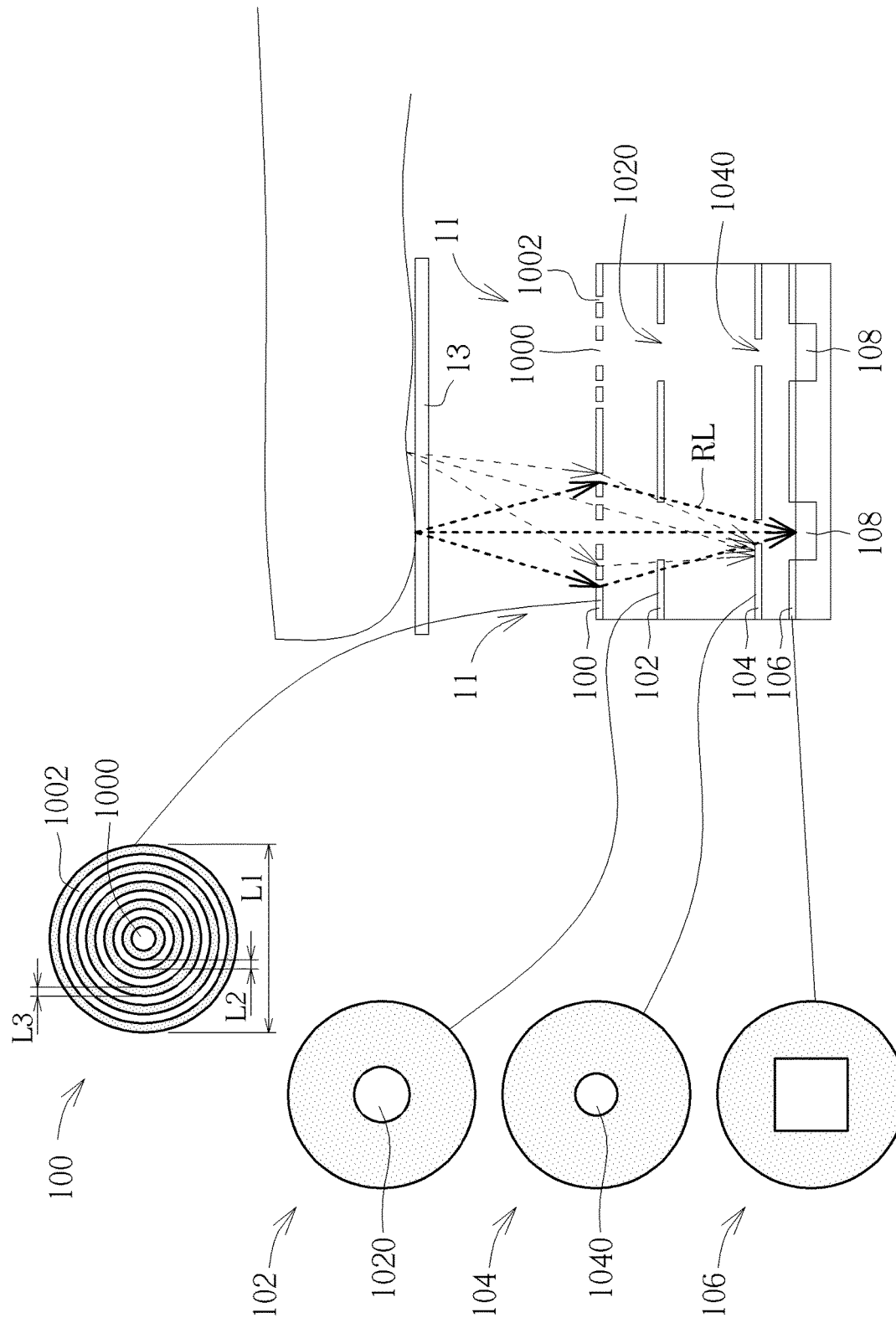
FIG. 2 is a schematic diagram of a sectional side view of the sensing unit of the optical sensing array shown in FIG. 1A and FIG. 1B.

Then, please refer to FIG. 2. The right side of FIG. 2 is a schematic diagram of a sectional side view of the sensing units 11 of the optical sensing array 10 shown in FIG. 1A and FIG. 1B. As shown in FIG. 2, each sensing unit 11 comprises a focusing layer 100, a blocking layer 102, a shading layer 104, an aperture layer 106 and an optical sensor 108. The optical sensing array 10 receives the reflected light RL reflected by the finger. The reflected light RL is focused when the reflected light RL passes through the focusing layer 100. The noise of the reflected light RL is filtered out when the reflected light RL passes through the blocking layer 102, the shading layer 104 and the aperture layer 106. Then, the reflected light RL is sensed by the optical sensor 108. In detail, the focusing layer 100 comprises light paths of concentric circles having a round opening 1000 and a plurality of circular openings 1002 with different diameters circling around the round opening 1000 to construct a concentric circles pattern so as to focus the reflected light RL. The blocking layer 102 is disposed under the focusing layer 100 for blocking the diffracted reflected light RL to reduce the diffraction phenomenon of the reflected light RL. The shading layer 104 is disposed under the blocking layer 102 for controlling the incident angle of the reflected light RL. It is noted that the blocking layer 102 comprises a second round opening 1020 and the shading layer 104 comprises a third round opening 1040. For better controlling the incident angles of the reflected lights RL by the shading layer 104, the diameter of the third round opening 1040 may be preferably adjusted according to the diameter of the second round opening 1020. In the embodiment, the diameter of the second round opening 1020 is larger than the diameter of the third round opening 1040. The aperture layer 106 is disposed under the shading layer 104 and above the optical sensor 108 for blocking the stray light of the reflected light RL. The optical sensor 108 is a charge-coupled device (CCD) for sensing the reflected light RL to obtain the fingerprint information.

Notably, since the focusing layer 100 is utilized for focusing the reflected light RL, the distance between the focusing layer 100 and the optical sensor 108 determines the diffraction angle of the reflected light RL after the reflected light RL passes through the light path of concentric circles on the focusing layer 100. In addition, the distances between layers of the focusing layer 100, the blocking layer 102, the shading layer 104 and the aperture layer 106 may be properly adjusted according to the width of ridges/valleys, the distribution of the feature points of the fingerprint, the brightness of the reflected light RL, the thickness of the glass panel 13 and the wavelength of the reflected light RL.

Please continue referring to FIG. 2, which illustrates a top view of the focusing layer 100, the blocking layer 102, the shading layer 104 and the aperture layer 106 of the sensing unit 11 on the left side of FIG. 2. As shown in FIG. 2, the focusing layer 100 comprises the light path of concentric circles having the round opening 1000 and the plurality of circular openings 1002 with different diameters to form the concentric circles pattern so as to focus the reflected light RL. It is noted that the focusing layer 100 is made of black materials which absorb light and the light paths of concentric circles form round slits. Different from the prior art where the optical lens is constructed by the Fresnel lens to decrease the thickness of the lens, the present invention utilizes the light paths of concentric circles on the focusing layer 100 to diffract the reflected light RL so as to generate a Poisson Spot phenomenon and focus the reflected light RL. Notably, through the light paths of concentric circles on the focusing layer 100, the present invention may effectively diffract and focus the reflected light RL; meanwhile, the focusing layer 100 may be constructed in a planar structure of single layer and made of black materials absorbing light. The thickness and size of the optical sensing array 10 and the complexity of manufacturing process may be substantially decreased, therefore.

In another aspect, the focusing layer 100 is utilized for focusing the reflected light RL reflected by the finger. Therefore, the width of concentric circles L1, the slit widths L2, the spacing distance(s) of slits L3 or the amount of the slits may be properly adjusted according to the distribution of the feature points of the fingerprint or the arrangements of the optical sensing array 11. In addition, the width of concentric circles L1 may be determined according to the distribution, the width or the density of the feature points of the fingerprint. In order to obtain the sufficient brightness of the reflected light for the better signal quality of the sensing signal, the slit widths L2 and the amount of the slits may be flexibly adjusted according to the brightness. Notably, to focus the reflected light RL at the center of the optical sensor 108, the spacing distances of slits L3 may be inconsistent, wherein the spacing distances of slits L3 may be adjusted according to the distances between the slits with the center of the round opening 1000. Through adjustment of the width of concentric circles L1, the slit widths L2 and the spacing distances of slits L3 according to the area of the optical sensor 108 for receiving the reflected light RL, the reflected light RL may be properly focused on the optical sensor 108 to obtain the better signal quality of the sensing signal.

In addition, as shown on the left side of FIG. 2, the round opening 1020 of the blocking layer 102 is made of black materials which absorb light, and utilized for blocking part of the reflected light RL after the reflected light RL passes through the focusing layer 100 and is diffracted by the focusing layer 100, such that the optical sensor 108 may receive the reflected light RL with less diffraction phenomenon. The reflected light RL may be properly focused and noise may be decreased. The signal quality of the reflected light RL is therefore improved by the blocking layer 102. The shading layer 104 also comprises a round opening having a smaller diameter compared to the blocking layer 102, utilized for limiting the range and the direction of the reflected light RL. Notably, the shading layer 104 may be formed in a structure having multiple layers for effectively limiting the incident angle of the reflected light RL. Specifically, the shading layer 104 with the structure having multiple layers may be disposed according to the arrangement of the sensing units 11 of the fingerprint identification system 1 for effectively blocking the reflected light RL scattered from the neighboring or other sensing units 11 to decrease the noise. The aperture layer 106 comprises a square opening, disposed above the optical sensor 108 to reduce the noise resulted from the shift of the reflected light RL.

In addition, the aperture layer 106 and the optical sensor 108 of the sensing unit 11 may be formed by the manufacturing process of the complementary metal-oxide-semiconductor process (CMOS process). The focusing layer 100, the blocking layer 102 and the shading layer 104 may be formed above the aperture layer 106 and the optical sensor 108 through the lithography process. The focusing layer 100, the blocking layer 102 and the shading layer 104 may be formed by the epitaxy process, the stacking process or the etching process. In addition, the aperture layer 106 may be made of metal materials and selectively formed above the optical sensor 108 by the manufacturing process the same as that of the optical sensor 108, or under the shading layer 104 by the manufacturing process the same as that of the focusing layer 100, the blocking layer 102 and the shading layer 104. In other words, the manufacturing process to form the aperture layer 106 is not limited to the CMOS process or epitaxy process, etc. and may be adjusted according to different design concepts of the optical sensing array 10.

In detail, please refer to FIG. 3A to FIG. 3E. FIG. 3A to FIG. 3E illustrate a manufacturing process for the optical sensing array 10 according to an embodiment of the present invention. As shown in FIG. 3A, the optical sensor 108 is formed on the silicon substrate by the CMOS process. As shown in FIG. 3B, the aperture layer 106 is formed on the optical sensor 108, wherein the aperture layer 106 can be formed by the CMOS process or formed by the epitaxy process, the stacking process or the etching process as long as the aperture layer 106 is formed on the optical sensor 108 to block the stray light. The shading layer 104 is formed on the aperture layer 106. The blocking layer 102 is formed on the shading layer 104. Then, the focusing layer 100 is formed on the blocking layer 102. The focusing layer 100, the blocking layer 102 and the shading layer 104 are formed above the aperture layer 106 by the epitaxy process, the stacking process or the etching process. The manufacturing process for the aperture layer 106 may be selected according to the manufacturing requirements or the user demands so as to form the aperture layer 106 on the optical sensor 108.

Figure 4:
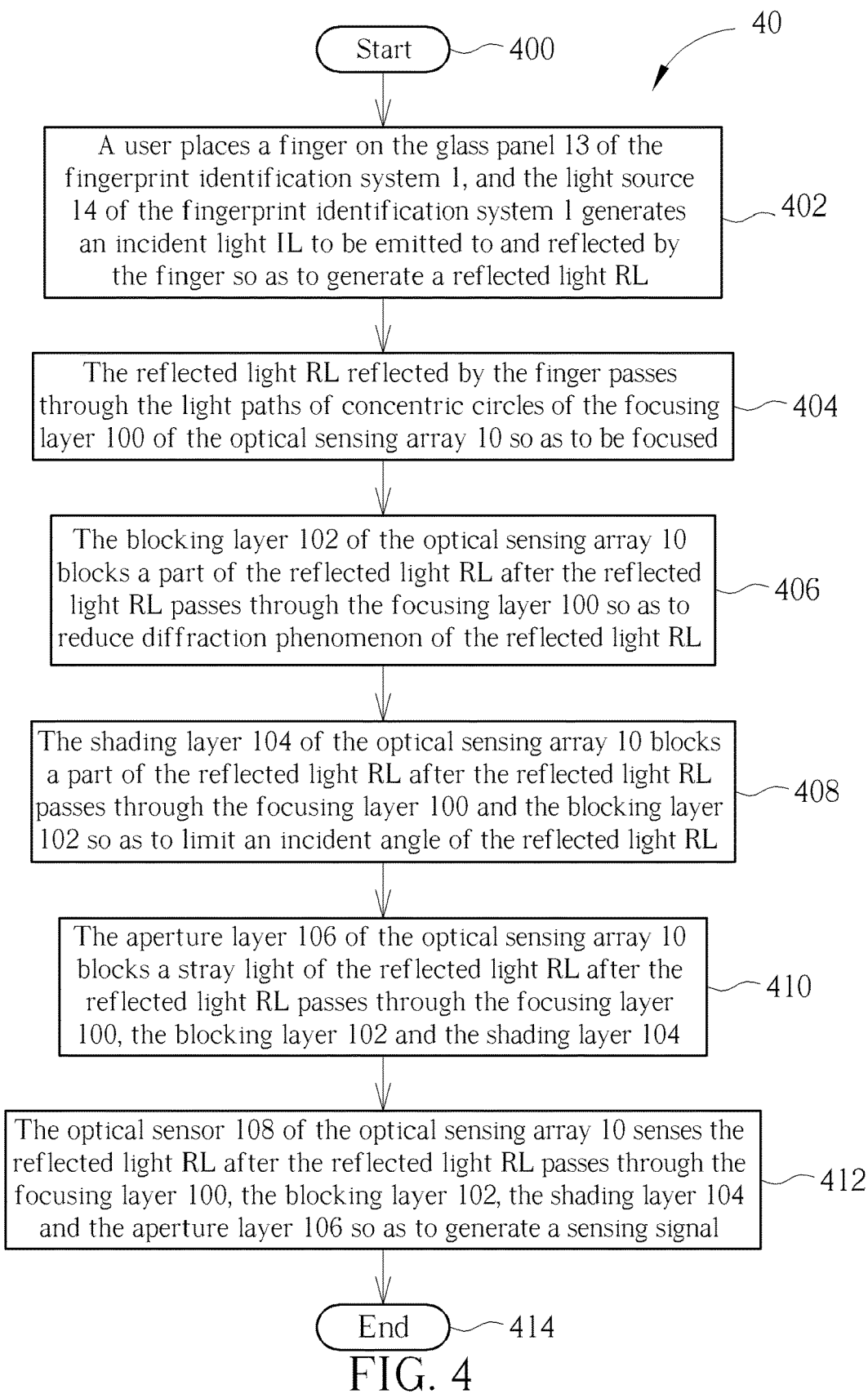
FIG. 4 is a schematic diagram of a process according to an embodiment of the present invention.

Furthermore, please refer to FIG. 4. As shown in FIG. 4, the operation of the fingerprint identification system 1 maybe summarized as a process 40. The process 40 comprises the following steps:

Step 400: Start.

Step 402: A user places a finger on the glass panel 13 of the fingerprint identification system 1, and the light source 14 of the fingerprint identification system 1 generates an incident light IL to be emitted to and reflected by the finger so as to generate a reflected light RL.

Step 404: The reflected light RL reflected by the finger passes through the light paths of concentric circles of the focusing layer 100 of the optical sensing array 10 so as to be focused.

Step 406: The blocking layer 102 of the optical sensing array 10 blocks a part of the reflected light RL after the reflected light RL passes through the focusing layer 100 so as to reduce diffraction phenomenon of the reflected light RL.

Step 408: The shading layer 104 of the optical sensing array 10 blocks a part of the reflected light RL after the reflected light RL passes through the focusing layer 100 and the blocking layer 102 so as to limit an incident angle of the reflected light RL.

Step 410: The aperture layer 106 of the optical sensing array 10 blocks a stray light of the reflected light RL after the reflected light RL passes through the focusing layer 100, the blocking layer 102 and the shading layer 104.

Step 412: The optical sensor 108 of the optical sensing array 10 senses the reflected light RL after the reflected light RL passes through the focusing layer 100, the blocking layer 102, the shading layer 104 and the aperture layer 106 so as to generate a sensing signal.

Step 414: End.

First, in Step 402, the user places the finger on the glass panel 13 of the fingerprint identification system 1, and the light source 14 of the fingerprint identification system 1 generates the incident light IL to be emitted to and reflected by the finger of the user so as to generate the reflected light RL, such that the fingerprint identification system 1 may accordingly perform the fingerprint identification. In Step 404, the fingerprint identification system 1 utilizes the light paths of concentric circles of the focusing layer 100 of the optical sensing array 10 to focus the reflected light RL reflected by the finger to receive the reflected light RL with a larger incident angle. In Step 406, the fingerprint identification system 1 utilizes the blocking layer 102 of the optical sensing array 10 to block the reflected light RL which has passed through the focusing layer 100 to reduce the diffraction phenomenon of the reflected light RL so as to improve the signal quality of the sensing signal. In Step 408, the fingerprint identification system 1 utilizes the shading layer 104 of the optical sensing array 10 to block a part of the reflected light RL which has passed through the focusing layer 100 and the blocking layer 102, such that the reflected light RL may be focused within a proper incident angle. The width, the density or the shape of the round openings of the shading layer 104 maybe adjusted according to the spacing distances of the sensing units 11 of the optical sensing array 10, such that the shading layer 104 is able to block the scattering light from the neighboring or other sensing units 11 so as to decrease noise. In Step 410, the fingerprint identification system 1 utilizes the aperture layer 106 of the optical sensing array 10 to block the stray light of the reflected light RL which has passed through the focusing layer 100, the blocking layer 102 and the shading layer 104, such that the sensing range on the optical sensor 108 can be properly limited so as to improve the signal quality of the sensing signal. In Step 412, the fingerprint identification system 1 utilizes the optical sensor 108 of the optical sensing array 10 to sense the reflected light RL which has passed through the focusing layer 100, the blocking layer 102, the shading layer 104 and the aperture layer 106. The fingerprint identification system 1 may perform the fingerprint identification to verify the user identity according to the sensing signals generated by the optical sensors 108.

Figure 5:
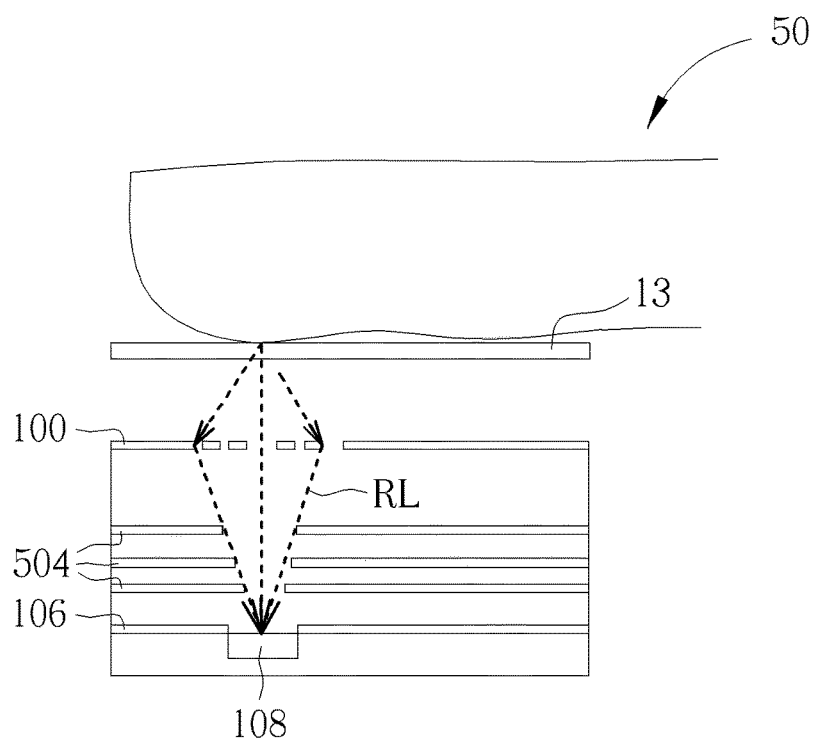
FIG. 5 is a schematic diagram of a sectional side view of an optical sensing array according to an embodiment of the present invention.

Notably, the embodiments described in the above are utilized for illustrating the concept of the present invention, which is not limited hereto, and those skilled in the art may make modifications and alterations accordingly, which are also within the scope of the invention. For example, please refer to FIG. 5, which is a schematic diagram of a sectional side view of an optical sensing array 50 according to an embodiment of the present invention. The optical sensing array 50 is similar to the optical sensing array 10, and thus, the same components are denoted by the same symbols. As shown in FIG. 5, the optical sensing array 50 comprises a plurality of shading layers 504. It is noted that the blocking layer 102 shown in FIG. 1 may be combined into the structure of multiple layers of the shading layer 504 as long as the diffraction of the reflected light RL after passing through the focusing layer 100 may be blocked or reduced and the incident angle of the reflected light RL may be properly limited. Therefore, the noise can be reduced and the optical sensor 108 may sense the reflected light RL with better signal quality. In addition, the shape of the aperture layer 106 may also be adaptively adjusted to the shape of rectangular, diamond or circle according to system requirements as long as the stray light may be blocked by the aperture layer 106 and isolated from the optical sensor 108.

Figure 6:
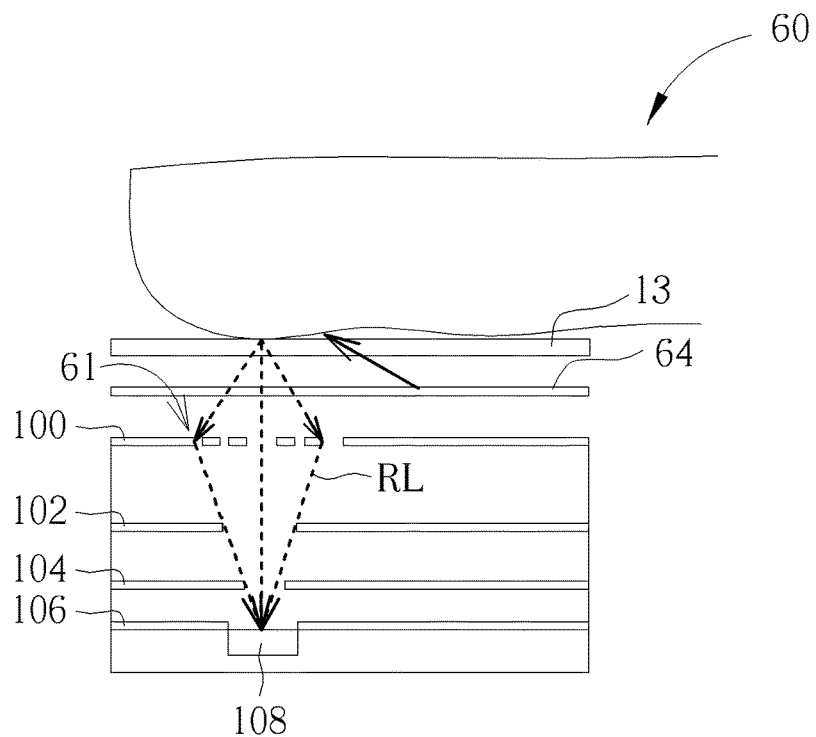
FIG. 6 is a schematic diagram of a sectional side view of an optical sensing array according to embodiment of the present invention.

In addition, please refer to FIG. 6, which is a schematic diagram of a sectional side view of an optical sensing array 60 according to embodiment of the present invention. The optical sensing array 60 is similar to the optical sensing array 10, and thus, the same components are denoted by the same symbols. As shown in FIG. 6, the light source 64 is disposed on the focusing layer 100 of the sensing unit 61, and the light source 64 is an organic light emitting diode (OLED) display, wherein the light source 64 (OLED) generates the incident light which is emitted to and reflected by the finger so as to the generate reflected light RL. The sensing unit 61 receives the reflected light RL reflected by the finger of the user. The optical sensing array 60 may obtain better signal quality of the sensing signals to perform fingerprint identification by disposing the light source 64 on the focusing layer 100.

In summary, the optical sensing array 10 of the present invention focuses the reflected light through the focusing layer 100, utilizes the light paths of concentric circles for obtaining a larger incident angle of the reflected light, further utilizes the blocking layer 102, the shading layer 104 and the aperture layer 106 to block the stray light, and utilizes the optical sensor 108 to sense the reflected light which reaches the optical sensor 108 after passing through the focusing layer 100, the blocking layer 102, the shading layer 104 and the aperture layer 106 optical sensor The optical sensing array 10 of the present invention may effectively control the range of the incident angle and the direction of the reflected light and decrease the noise so as to improve the signal quality of the sensing signal generated by the optical sensor 108 and further increase the recognition rate of fingerprint identification.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A fingerprint identification system, comprising:
a panel, for placing a finger;
a light source, disposed under the panel, for generating an incident light, wherein the incident light is emitted to and reflected by the finger to generate a reflected light;
a processor, for performing fingerprint identification on the finger according to a plurality of sensing signals; and
an optical sensing array, disposed under the panel and coupled to the processor, comprising a plurality of sensing units for generating the plurality of sensing signals, each of the sensing units comprising:
an optical sensor, for receiving the reflected light reflected by the finger to generate the sensing signal;
a focusing layer, disposed under the panel, for focusing the reflected light reflected by the finger;
a blocking layer, disposed under the focusing layer, for blocking a part of the reflected light to reduce a diffraction phenomenon of the reflected light;
a shading layer, disposed under the blocking layer, for blocking a part of the reflected light to limit an incident angle of the reflected light; and
an aperture layer, disposed under the shading layer and on the optical sensor, for blocking a stray light.
2. The fingerprint identification system of claim 1, wherein the focusing layer comprises a round opening and a plurality of circular openings with different diameters surrounding the round opening so as to form light paths of concentric circles.
3. The fingerprint identification system of claim 1, wherein when the reflected light passes through the focusing layer, the reflected light is diffracted and focused by passing through the light paths of concentric circles.
4. The fingerprint identification system of claim 1, wherein the blocking layer comprises a second round opening, the shading layer comprises a third round opening, and a diameter of the second round opening is larger than a diameter of the third round opening.

5. The fingerprint identification system of claim 1, wherein the aperture layer is made of metal.

6. The fingerprint identification system of claim 1, wherein the aperture layer comprises a square opening.

7. The fingerprint identification system of claim 1, wherein a color of the shading layer and the focusing layer is black, and the shading layer and the focusing layer are made of materials which absorb light.

8. The fingerprint identification system of claim 1, wherein the light source is an organic light emitting diode display.

9. A sensing method, for a fingerprint identification system comprising a panel, a light source and an optical sensing array for performing fingerprint identification, the sensing method comprising:
generating an incident light by the light source of the fingerprint identification system when a user placing a finger on the panel of the fingerprint identification system, wherein the incident light is emitted to and reflected by the finger to generate a reflected light;
focusing the reflected light reflected by the finger by light paths of concentric circles of a focusing layer of the fingerprint identification system to;
blocking a part of the reflected light after the reflected light passing through the focusing layer by a blocking layer of the fingerprint identification system to reduce a diffraction phenomenon of the reflected light;
blocking a part of the reflected light after the reflected light passing through the focusing layer and the blocking layer by a shading layer of the fingerprint identification system to limit an incident angle of the reflected light;
blocking a stray light of the reflected light after the reflected light passing through the focusing layer, the blocking layer and the shading layer by an aperture layer of the fingerprint identification system ; and
sensing the reflected light after the reflected light passing through the focusing layer, the blocking layer, the shading layer and the aperture layer by an optical sensor of the fingerprint identification system so as to generate a sensing signal.

10. The sensing method of claim 9, wherein the step of focusing the reflected light reflected by the finger by light paths of concentric circles of a focusing layer of the fingerprint identification system is generating a diffraction phenomenon on the reflected light so as to focus the reflected light when the reflected light passes through the light paths of concentric circles of the focusing layer.

11. A manufacturing method for manufacturing an optical sensing array, comprising:
forming an optical sensor on a silicon substrate, wherein the optical sensor is utilized for receiving a reflected light from a finger to generate a sensing signal;
forming an aperture layer above the optical sensor, wherein the aperture layer is utilized for blocking a stray light of the reflected light;
forming a shading layer on the aperture layer, wherein the shading layer is utilized for blocking a part of the reflected light to limit an incident angle of the reflected light;
forming a blocking layer on the shading layer, wherein the blocking layer is utilized for blocking a part of the reflected light to reduce a diffraction phenomenon of the reflected light; and
forming a focusing layer on the shading layer, wherein the focusing layer is utilized for focusing the reflected light reflected by the finger.

12. The manufacturing method of claim 11, further comprising forming a round opening and a plurality of circular openings with different diameters surrounding the round opening on the focusing layer so as to form light paths of concentric circles.

13. The manufacturing method of claim 11, further comprising forming a second round opening on the blocking layer and forming a third round opening on the shading layer, wherein a second diameter of the second round opening is larger than a third diameter of the third round opening.

14. The manufacturing method of claim 11, wherein a color of the shading layer and the focusing layer is black, and the shading layer and the focusing layer are made of materials which absorb light.

15. The manufacturing method of claim 11, wherein the aperture layer is made of metal.

16. The manufacturing method of claim 11, wherein the aperture layer is formed by a manufacturing process the same as that for forming the optical sensor or the focusing layer.

17. The manufacturing method of claim 11, wherein the focusing layer, the blocking layer and the shading layer are formed by a manufacturing process selected from an epitaxial process, a stacking process or an etching process.

18. The manufacturing method of claim 11, wherein the optical sensor is formed by a manufacturing process of manufacturing a complementary metal-oxide-semiconductor field-effect transistor.

* * * * *